Nov. 17, 1959 A. L. HARRINGTON ET AL 2,913,358

METHOD FOR FORMING PASSIVATION FILMS ON SEMICONDUCTOR BODIES AND ARTICLES RESULTING THEREFROM

Filed July 21, 1958

ALAN L. HARRINGTON,
THOMAS C. HALL,

INVENTORS

BY Spensley and Horn

ATTORNEYS

United States Patent Office 2,913,358

Patented Nov. 17, 1959

2,913,358

METHOD FOR FORMING PASSIVATION FILMS ON SEMICONDUCTOR BODIES AND ARTICLES RESULTING THEREFROM

Allan L. Harrington, Hollywood, and Thomas C. Hall, Playa Del Rey, Calif., assignors to Pacific Semiconductors, Inc., Culver City, Calif., a corporation of Delaware Application July 21, 1958, Serial No. 749,620

13 Claims. (Cl. 117—200)

Figure 1:
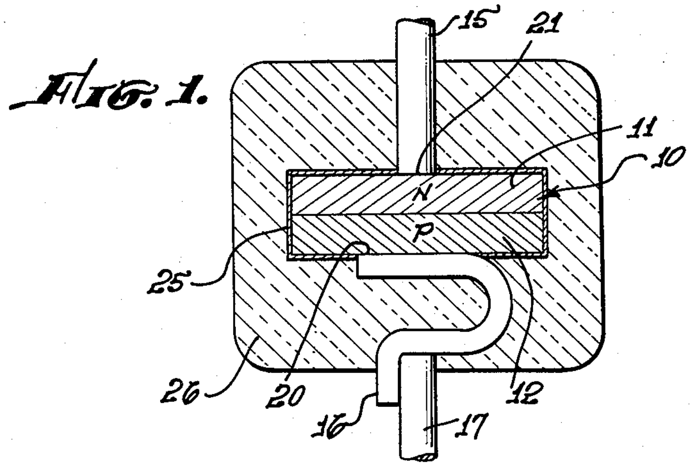

This invention relates to semiconductor devices and more particularly to the surface treatment of semiconductor crystal bodies of such devices to obtain moisture protection and surface passivation from impurities.

In the semiconductor art, a region of semi-conductor material containing an excess of donor impurities and yielding an excess of free electrons is considered to be an impurity-doped N-type region. An impurity-doped P-type region is one containing an excess of acceptor impurities resulting in a deficit of electrons, or an excess of holes. Stated differently, an N-type region is one characterized by electron conductivity, whereas a P-type region is one characterized by hole conductivity. When a continuous, solid crystal specimen of semiconductor material has an N-type region adjacent a P-type region the boundary between the two regions is termed a P–N or an N–P junction, or simply, a junction. Such a specimen of semiconductor material is termed a junction semiconductor device and may be used as a rectifier. A solid crystal specimen having two such junctions is termed a transistor. In addition to the junction type semiconductor devices, the point contact type and diffused junction type semiconductor devices are also now well known to the art.

The term semiconductor material as utilized herein is considered generic to germanium, silicon, and germanium-silicon alloys, as well as intermetallics such as indium-phosphorus alloy and the like, and is employed to distinguish these semiconductors from metallic oxide semiconductors such as copper-oxide, and selenium.

As is now well known to the art, the condition of the semiconductor surface is a primary factor in determining the performance and reliability of a semiconductor device and such devices are particularly adversely affected by the presence of moisture on the semiconductor surface.

In order to obtain satisfactory or optimum electrical characteristics of the device it is necessary to preclude the presence of moisture and contaminants at or extending across the P–N junction. The presence of water causes electronic conduction; that is, water conducts current across the junction. It is necessary therefore, during the production of semiconductor translating devices to remove both moisture and substances which will attract or ionize with water at the crystal surface and to render the surface of the crystal impervious to moisture in the ambient. Various means have been used in the art to clean the surface of the crystal and particularly to remove hydrophilic substances, after which further means are utilized to render the crystal impervious to moisture which may precipitate or deposit upon exposure of the semiconductor body to ambient conditions. The most common method of the prior art for cleaning or etching the semiconductor body is to dip the body in an etchant solution of acid such as a mixture of hydrofluoric and nitric acid to dissolve impurities or contaminants present at the surface of the body.

On the surface of a silicon crystal, after conventional etching, as above, or abrasion in air, there forms very quickly a thin layer of silicon dioxide (silica). The film is estimated to be 50–100 A. in thickness. Due to the close proximity of the film to the elemental silicon, the film may be partially reduced, having the formula $SiO_n$ where $0<n<2$. Although the physical and chemical properties of the silica film may deviate slightly from that of bulk silica due to the large surface to volume ratio, the properties of the film may be considered equal to those of bulk silica. The tendency of silica to take up relatively large quantities of water is well known and the equally well known effects of water vapor on semiconductor devices lends support to the view that the silicon oxide film forms a kind of two dimensional liquid solution in which trapped ions are free to migrate in local electric fields. An immediate, at least partially reversible fast change (measured in seconds) in device characteristics is observed, followed by a long term (measured in hours or days) irreversible degradation after exposure to water vapor. The fast change may be due to changes in the underlying semiconductor surface due to lifetime and field effect in addition to the migration of ion and dipole species in the two dimensional electrochemical solution existing on the surface. Thus, depletion, enrichment, or inversion layers may be produced in the semiconductor, together with alterations in surface recombination velocity, with consequent effects on device characteristics.

Within the silica film itself, wherever a field exists, irreversible electrochemical processes may be expected to take place; thus contributing to the long term, and largely irreversible, degradation. The possibility of electronic conduction processes within the film also is present. The combined ionic and electronic currents contribute to high leakage currents often observed in back-biased P–N junctions. Attempts have been made in the prior art to produce stability in device characteristics by building up the native oxide film, by electrochemical or direct high temperature oxidation of the silicon surface. These efforts have not been sufficiently successful in device passivation, due to the inevitable inclusion of minute concentrations of ion and dipole contaminants and their high mobility in the relatively large quantity of water absorbed by the film due to the hydrophilic nature of silica. In addition, the build-up of internal stress due to the mismatch of crystal lattices between crystalline silica and silicon becomes so great as to cause cracking and slough-off of films which are thick enough to give the required protection. It is likely also that these internal stresses provide electronic conduction or leakage pathways in the film. Thus, the use of the oxide film in the prior art in adjusting and fixing the condition of the semiconductor surface is not wholly effective.

In addition to coating the semiconductor surface by a native oxide film it is also a common method of rendering the surface impervious to moisture by quenching the body in water after it has been cleaned and etched and then coating the surface of the body with silicone varnish. The body is then baked at an elevated temperature for an extended period of time. An example of the common baking procedure after application of the silicone varnish is to bake the semiconductor body for approximately four hours at a temperature of 150°–300° C. Such an extended baking period is disadvantageous in mass production techniques and further difficulties and limitations are encountered due to the temperatures involved. Such films are formed over any moisture impurities which are present at the time the film is applied and thereby allow the impurities and moisture to continue to conduct current across the junction.

Accordingly, it is an object of the present invention to provide a method and means for passivating the surface of semiconductor devices.

It is another object of the present invention to provide means for treating the surface of a semiconductor body to render the body moisture repellent or hydrophobic.

It is a further object of the present invention to provide a means for forming a semiconductor device having on the surface thereof a chemically bonded, high temperature stable, hydrophobic film of substantial thickness.

Yet another object of the present invention is to provide a method and means of surface treatment of semiconductor devices which is less time consuming than methods heretofore known to the art and which avoids the necessity for subjecting the body to elevated temperatures for extended periods of time.

Another object of the present invention is to provide moisture resistant semiconductor devices having improved electrical characteristics and which are stabilized against changes due to ambient humidity variations.

A still further object of the present invention is to provide a protective surface layer for semiconductor bodies to insulate the surface of the body from ambient atmosphere, which layer is permanent in its insulation and lasting in effect.

The present invention comprises the method of generating a relatively thick polysiloxane film, i.e., at least one micron, and usually ranging from 1 to 25 microns on the previously treated surface of semiconductor material by the generation or copolymerization of a mixture of polyfunctional organo-silicon monomers which interact and react with the semiconductor surface, and a thin film formed thereon by the previous treatment, to yield a space polymer which is integral with the previously treated and real surface of the semiconductor device. The monomeric organo-silicon materials utilized in accordance with this invention are those that can be represented by the general formula $R_nS_iX_{4-n}(n\leqq 4)$ where X is a chemically active grouping, such as, halogen, for example, Cl, hydroxy, OH, alkoxy groups such as methoxy, $CH_3O$, ethoxy, $C_2H_5O$, mercapto SH, amino NH. R is a hydrocarbon residue grouping, such as, for example, methyl, $CH_3$, ethyl $C_2H_5$, phenyl, $C_6H_5$, which are relatively inert as well as epoxy,

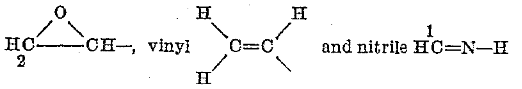

which are active chemically. Previous treatment of the semiconductor material is such that a relatively thin (i.e., less than one micron in thickness) film comprising an ester of the silicon has been integrally and chemically bonded to the surface as, for example, by a rapid quench of the body from an etch solution containing HF as a principal ingredient to a quench solution of an organic liquid which has in its structure a chemically reactive grouping.

The novel features which are believed to be characteristic of the present invention, both as to its organization and method of operation, together with further objects and advantages thereof will be better understood from the following description considered in connection with the accompanying drawing. It is to be expressly understood, however, that the drawing is for the purpose of illustration and example only, and it is not intended as a definition of the limits of the invention.

Figure 2:
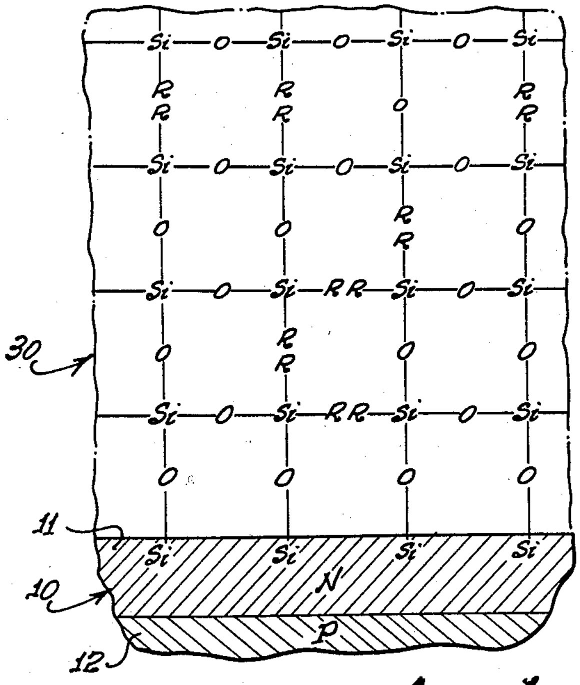

In the drawing:

Figure 1 is a view, partly in section, showing a silicon diode having an integrally bonded protective layer in accordance with the present invention; and Figure 2 is a schematic view showing the silicon body of Figure 1 chemically bonded to the polysiloxane film in accordance with the present invention.

In Figure 1 there is shown a diode 10 which has an integrally bonded protective passivation layer surrounding the same. The diode 10 includes an N-type conductivity region 11 which may, for example, be the result of the presence of arsenic introduced during the crystal growing process. Adjacent the region 11 is a P-type conductivity region 12 formed, for example, by the diffusion of boron therein. An electrode 15 is bonded to the N-type conductivity region 11 at 21 by any means well known to the art. A spring contact 16 is likewise bonded at 20 to the P-type conductivity region 12. A second electrode 17 similar to electrode 15 is welded or otherwise joined to spring contact 16. After the diode 10 has been fabricated by joining the electrodes as hereinabove described a polysiloxane film 26 is integrally and chemically bonded thereto resulting in an intermediate esterified film 25 between the film 26 and the diode 10. The polysiloxane film 26 is produced in a manner hereinafter to be described.

In Figure 2 for purposes of clarity of explanation the diode 10 is shown together with a symbolic view of the molecular space polymer of the polysiloxane film 26. That portion of the space polymer which is chemically bonded to the upper surface of the diode 10 is indicated by numeral 30. This is merely intended to present a single plane presentation of the polysiloxane film, whose structure and method of production will hereinafter be fully described. It is, of course, understood that the polysiloxane film will completely surround the diode 10 as is shown in Figure 1.

It will further be understood that a diode is shown as the semiconductor body to which the film, in accordance with the present invention, is bonded for purposes of example only. Any semiconductor body including, but not limited to, transistors, photocells and the like, may similarly have a film 26 bonded thereto, in accordance with the present invention.

In accordance with the present invention it has been found that a semiconductor device having stabilized and improved electrical characteristics is provided by forming an integrally bonded protective passivation layer between the semiconductor material and the ambient atmosphere. The protective layer is synthesized in situ on the semi-conductor surface upon which an integrally bonded thin film comprising an ester of the underlying material has previously been formed in the manner described in detail in copending U.S. patent application, Serial No. 749,624, titled, Improved Service Treatment of Semiconductor Bodies, by A. Harrington and Stanley Pessok, assigned to the assignee of the present application and filed concurrently herewith. The passivation layer forms a continuous molecular structure between the relatively thin film previously generated to form a continuous molecular structure between the semiconductor material and the protective layer, rather than an interface between the two as is common in the prior art. By the method of the present invention the protective layer is formed under contaminant free conditions, and is hydrophobic and stable throughout an extended range of temperatures.

As an illustrative application of the present invention the complete surface treatment of a silicon semiconductor body by the method of this invention will now be described in some detail and various illustrative mixtures of the chemical materials used in forming the passivation layer will be given.

In order to form a passivation layer of relatively great thickness in accordance with this invention, it is necessary to first form a relatively thin film comprising an ester of the silicon material which is integrally and chemically bonded to the silicon surface. Such a film is formed by the method described and claimed in copending application Ser. No. 749,624, supra. For example, the silicon body is immersed in an etch solution containing hydrofluoric acid as a principal element for a length of time sufficient to remove foreign matter and contaminants from the surface of the silicon. The etch solution contains, for example, two parts by volume of hydrofluoric acid (about 48% concentration in water) and one part of nitric acid (about 90% concentration in water). The silicon body is then swiftly removed from the etch and immersed in a quench solution comprising primarily an organic liquid which has in its chemical structure a reactive hydroxyl group (broadly designated hereinafter as ROHO specifically, a monohydric or polyhydric aliphatic alcohol containing from 1 to 4 carbon atoms per molecule. A 95% ethanol solution is particularly preferred. It is necessary to transfer the silicon body quickly from the etch solution to the quench solution to prevent undue exposure to the ambient. Hydrofluorosilicic acid ($H_2SiF_6$) formed at the silicon surface when the body is immersed in the quench solution, will react with the ROH at the silicon surface to form ester groups which are molecularly bonded with the silicon as a film upon the silicon surface. The film is less than 1 micron and normally on the order of 100 to 1000 angstrom units in thickness. Quenching times ranging from about 5 seconds to 5 minutes may be suitably employed.

After formation of the relatively thin film comprising an ester of the underlying semiconductor material, i.e., silicon, the ester is reacted by reacting the ester groupings on the surface of the semiconductor material, in the thin film formed thereon, with a mixture comprising tri functional silane monomers and mono- or di-functional monomers, or both, in predetermined proportion, together with reactive and inert catalysts as described in detail hereinafter. The body is immersed in the liquid monomeric mixture in this embodiment and the mixture is agitated to insure complete wetting of the surface. Other methods of wetting can, of course, be utilized as long as the wetting action is complete.

The esterified film is reacted with a mixture of organosilane compounds, in which a trifunctional monomer predominates. The reactive group X, of such monomers having the formula $RSiX_3$ can be any of a wide variety. The most reactive is the hydroxyl group but trihydroxy compounds have the disadvantage that they rapidly autopolymerize. Consequently we prefer to use, as a starting material, a tri-alkoxy compound such as ethyl triethoxy silane and hydrolyze the alkoxy compound to the hydroxy compound just prior to use. Such hydrolysis may be effected in a medium of water, amyl alcohol, toluene (which is a solvent for the hydrolysis products) and hydrogen chloride, which acts as a catalyst.

The reactive groups may also be groups such as mercapto, amino, or halide groups. These groups are not quite so effective as the preferred alkoxy or hydroxy substituted silanes. Chloride groups, for example, form only relatively thin passivating films, whereas alkoxy and hydroxy compounds can be used to build up polymers of any desired thickness.

The addition of difunctional organo-silanes ($R_2SiX_2$) where R and X have the same definitions as previously, increases the plasticity of the resulting cross-linked polymer. Diphenyldihydroxysilane is particularly useful in this respect. Where the tri- and di-functional monomers are used alone, the ratio of tri- to di-functional compounds in the reaction mixture will be about 10 to 50% di-functional compounds, and the balance tri-functional.

The addition of mono-functional organo-silanes ($R_3SiX$) serves to provide chain-terminating groups on the cross-linked polymer. When used in combination with the tri-functional compound, alone, the mono-functional compound may be present in amounts of 1 to 10% by weight. The monofunctional compounds may be added per se, as in the case of triphenylsilanol, or they may be added in a form which yield mono-functional groups in the reaction medium. The addition of hexamethyl siloxane which dissociates into trimethyl silanes is an example of the latter.

When all three types of silane monomers are employed, the preferred amounts of each in the reaction mixtures will be as follows:

| | Percent by weight |
|---|---|
| Mono-functional | 1–5 |
| Di-functional | 5–45 |
| Trifunctional | Balance |

Specific illustrative passivation layer forming solutions in accordance with this invention are described hereinafter. It is to be understood that the following mixtures and resultant films represent only a few of many possible polymer structures within the scope of this invention. In addition to the silane monomers present in the mixture there are also included a suitable diluent and vehicle and preferably an antioxidant and a catalyst curing agent. The vehicle, antioxidant, and curing agent may be any of many well known compounds for carrying out these functions. Examples of suitable diluents and vehicles include ethyl alcohol, benzene, amyl alcohol, xylene, and toluene, while examples of suitable antioxidants include 2-napthyl phenyl amine, N-phenyl-2-naphthylamine, phenylene diamine and other amines or dihydroxy benzenes. Suitable catalyst curing agents include zinc octoate, carbon disulfide, hydrogen peroxide, lead octoate and organoperoxides. The proportion of each of the anti-oxidants and catalyst curing agents can be determined by one skilled in the art such that rapid oxidation and resultant crazing of the film will be prevented by the anti-oxidant. The proportion of catalyst curing agent is such that the film may be cured up to the desired thickness and desired properties of flexibility, temperature stability and electrical characteristics. An increased proportion of catalyst curing agent yields a greater thickness of film. Generally, the anti-oxidant will be present in amounts of from 11% to 1% by weight of the mixture and the catalyst in an amount of from .1% to 10% by weight of the mixture.

The coating composition is made up by first hydrolyzing the tri-functional compound, if necessary, in an aqueous solution, and then combining the resulting solution with the di-functional and mono-functional compounds. Next, the catalyst and anti-oxidant are added to the solution. The etched and surface-esterified silicon semi-conductor is then dipped in the solution until a coating of the desired thickness is built up. At this stage, the reaction mixture is partially polymerized by heating to a temperature of 80° to 100° C. for two to ten minutes, with five minutes being typical. During this initial polymerization, the solvents and diluents are driven off and the coating assumes a self-sustaining shape. The final curing is at a temperature of about 150° to 200° C. for a period of at least 6 hours. This final cure serves to complete the cross-linking in the polymer and to bond the polymer as an integral molecular coating onto the silicon base.

An illustrative film containing mono, di and tri functional silane monomers is as follows.

(1) Composition:

| Component | Concentration | Function |
|---|---|---|
| Hydrolyzed methyltriethoxysilane in toluene. | 40 ml | Trifunctional monomer. |
| Diphenyl silandiol | 8 gm | Difunctional monomer. |
| Hexamethyl disiloxane | 40 ml | Source of monofunctional units for use as chain terminators. |
| N-phenyl-2-naphthylamine | ½ gm | Oxidation inhibitor. |

(2) Polymer unit:

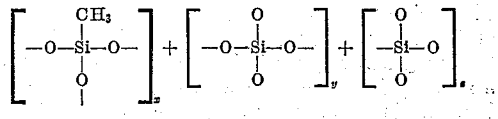

This polymer produces a film which is glass-like but not extremely brittle, and which remains intact after several days' exposure at 180° C. This film affords the best protection against ambient humidity for extended periods measured in weeks. It should be noted that while the composition recited contains a relatively large amount of mono-functional compound, this is due to the fact that the disiloxane decomposes into volatile products and only a portion of these products remain in the reaction mixture.

It is also possible to form the di- and mono-functional compounds by disproportionation of the tri-functional compound in the reaction mixture. A mixture of carbon disulfide and hydrogen peroxide is effective for this purpose. The following example illustrates such a composition.

(1) Composition:

| Component | Concentration, vol. percent | Function |
|---|---|---|
| Hydrolyzed ethyltriethoxysilane | 50 | Trifunctional monomer. |
| Carbon disulfide | 8 | Catalyst and disproportionating agents. |
| Hydrogen peroxide | 8 | |
| Ethyl alcohol | 34 | Diluent and vehicle. |

(2) Polymeric unit:

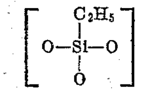

This results in a glassy infusible film which has a tendency to crack when overly cured. This film affords excellent protection on aluminum alloy diode structures until the film cracks during temperature aging. The film should be cured after packaging since it becomes too hard for whisker penetration.

The mechanism by which the thick film is integrally attached to the thin ester film is due to the fact that there are reactive groups, such as OR and OH groups in the thin film that react by co-condensation with similar reactive groups in the thick film with the elimination of volatile constituents such as alcohols and water.

The organic groupings of the film render it hydrophobic, thus preventing ionic leakage due to migration of trapped ions, dipoles, and the like in the adsorbed aqueous layer.

Thus, the present invention provides a method and means for forming a semiconductor device having on the surface thereof a chemically bonded passivating film of substantial thickness which is hydrophobic and stable at high temperature.

What is claimed is:

1. The method of generating a passivation film on a semiconductor body comprising the steps of: forming a relatively thin film on the semiconductor body which film comprises an ester of the material of the semiconductor body, and generating a relatively thick polysiloxane film as a space polymer integral with the esterified film and said underlying material.

2. The method of generating a passivation film on a semiconductor body comprising the steps of: forming a relatively thin film on the semiconductor body which film comprises an ester of the material of the semiconductor body, and generating a relatively thick polysiloxane film as a space polymer integral with the esterified film and said underlying material by polymerization of organo-silicon monomers.

3. The method of generating a passivation film on a semiconductor body comprising the steps of: forming a relatively thin film on the semiconductor body which film comprises an ester of the material of said semiconductor body, and generating a relatively thick polysiloxane film as a space polymer integral with said esterified film and said underlying material by the copolymerization of a predetermined mixture of poly-functional organo-silicon monomers.

4. The method of generating a passivation film on a semiconductor body comprising the steps of: etching said body in an etchant solution which includes hydrofluoric acid, removing said body from said etchant and quenching said body in a quench solution of an organic liquid which includes a chemically reactive grouping to form an esterified film of the material of said semiconductor body, and generating a relatively thick polysiloxane film as a space polymer integral with said ester and said underlying material by copolymerization of a mixture in pretermined proportions of a tri-functional silane monomer and at least one member of the group consisting of mono-functional and di-functional silane monomers.

5. The method of generating a passivation film on a silicon semiconductor body comprising the steps of: forming a relatively thin film on the silicon body which film comprises an ester of silicon, and generating a relatively thick polysiloxane film as a space polymer integral with said ester and said underlying silicon by copolymerization of a mixture in predetermined proportions of a tri-functional silane monomer and at least one member of the group consisting of mono-functional and di-functional silane monomers.

6. The method of forming a passivating coating on a silicon semiconductor body which comprises the steps of: forming an esterified film on the silicon surface, applying to the film a mixture of a tri-functional silane monomer and at least one member of the group consisting of mono-functional silane monomers and di-functional silane monomers, and curing the resulting coated body under conditions sufficient to produce a polysiloxane space polymer integrally bonded to said surface.

7. The method of forming a passivating coating on a silicon semiconductor body which comprises the steps of: forming an esterified film on the silicon surface, applying to the film a mixture of a hydrolyzed tri-functional silane monomer, a hydrolyzed di-functional silane monomer, and a hydrolyzed mono-functional silane monomer, in the proportion of 1–5% by weight mono-functional monomer, 5–40% by weight di-functional monomer, and the balance tri-functional monomer, and curing the resulting body under conditions sufficient to produce a polysiloxane space polymer integrally bonded to said surface.

8. The method of forming a passivating coating on a silicon semiconductor body which comprises the steps of: forming an esterified film on the silicon surface, applying to the film a mixture of a hydrolyzed trihydroxy silane monomer and at least one member of the group consisting of hydrolyzed mono-functional and hydrolyzed di-functional silane monomers, and curing the resulting coating under conditions sufficient to produce a polysiloxane space polymer integrally bonded to said surface.

9. The method of forming a passivating coating on a silicon semiconductor body which comprises the steps of: forming an esterified film on the silicon surface, coating the film with a mixture of a hydrolyzed tri-functional silane monomer and at least one member of the group consisting of hydrolyzed mono-functional and hydrolyzed di-functional silane monomers, partially polymerizing the resulting coating until the coating assumes a self-sustaining shape, and thereafter heating the partially polymerized coating at a temperature higher than employed in the partial polymerization to produce a polysiloxane space polymer integrally bonded to said surface.

10. A semiconductor body comprising a silicon body having integrally bonded thereto a polysiloxane space polymer having a thickness in excess of one micron.

11. A semiconductor body comprising a silicon body having an esterified surface film, said film being molecularly bonded to a polysiloxane space polymer.

12. A semiconductor body comprising a silicon body having an esterified surface film of a thickness of less than one micron and an overlying layer of a polysiloxane space polymer of a thickness in excess of one micron integrally bonded thereto.

13. A semiconductor body comprising a silicon body coated with an integrally bonded polysiloxane space polymer, said polymer being the reaction product of a hydrolyzed tri-functional monomer with at least one member of the group consisting of hydrolyzed mono-functional and hydrolyzed di-functional silane monomers.

References Cited in the file of this patent

UNITED STATES PATENTS

| | | |
|---|---|---|
| 2,754,456 | Madelung | July 10, 1956 |
| 2,798,189 | Alexander | July 2, 1957 |
| 2,809,132 | Bloem | Oct. 8, 1957 |
| 2,832,702 | Schwartz | Apr. 29, 1958 |